(12) United States Patent
Hsu et al.

(10) Patent No.: US 10,529,715 B2
(45) Date of Patent: Jan. 7, 2020

(54) INTEGRATED CIRCUIT STRUCTURE WITH SEMICONDUCTOR DEVICES AND METHOD OF FABRICATING THE SAME

(71) Applicant: UNITED MICROELECTRONICS CORP., Hsinchu (TW)

(72) Inventors: Wei-Lun Hsu, Hsinchu County (TW); Yung-Chien Kung, Tainan (TW); Ming-Tsung Yeh, Taipei (TW); Yan-Hsiu Liu, Tainan (TW); Am-Tay Luy, Zhubei (TW); Yao-Pi Hsu, Zhubei (TW); Ji-Fu Kung, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 10 days.

(21) Appl. No.: 15/427,512

(22) Filed: Feb. 8, 2017

(65) Prior Publication Data

US 2018/0204838 A1  Jul. 19, 2018

(30) Foreign Application Priority Data

Jan. 17, 2017 (CN) .......................... 2017 1 0036189

(51) Int. Cl.
| | |
|---|---|
| H01L 21/304 | (2006.01) |
| H01L 27/092 | (2006.01) |
| H01L 21/762 | (2006.01) |
| H01L 21/8238 | (2006.01) |
| H01L 21/761 | (2006.01) |
| H01L 21/8234 | (2006.01) |
| H01L 29/78 | (2006.01) |

(52) U.S. Cl.
CPC ........ *H01L 27/0922* (2013.01); *H01L 21/761* (2013.01); *H01L 21/76224* (2013.01); *H01L 21/823878* (2013.01); *H01L 21/823481* (2013.01); *H01L 21/823892* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 9,257,504 B2 | 2/2016 | Chan et al. | |
| 9,412,732 B2 | 8/2016 | Yamaji et al. | |
| 2006/0175635 A1* | 8/2006 | Arai ........................ | H01L 21/84 257/197 |
| 2014/0016012 A1* | 1/2014 | Oishi ...................... | H04N 5/372 348/311 |
| 2017/0069752 A1* | 3/2017 | Tajima ................ | H01L 29/7813 |
| 2018/0166536 A1* | 6/2018 | Shank ................. | H01L 29/1083 |

* cited by examiner

*Primary Examiner* — Joseph C. Nicely
*Assistant Examiner* — Lamont B Koo
(74) *Attorney, Agent, or Firm* — WPAT, PC

(57) ABSTRACT

An integrated circuit (IC) structure includes a substrate having several regions, several semiconductor devices formed at the substrate and respectively within the regions, and an ultra-deep (UD) trench isolation structure formed in the substrate. The substrate has a top surface and a bottom surface oppositely, and the UD trench isolation structure formed in the substrate surrounds peripheries of each of the regions for structurally and physically isolating the semiconductor devices within different regions. The UD trench isolation structure penetrates the substrate by extending from the top surface of the substrate to the bottom surface of the substrate.

12 Claims, 5 Drawing Sheets

INTEGRATED CIRCUIT STRUCTURE WITH SEMICONDUCTOR DEVICES AND METHOD OF FABRICATING THE SAME

This application claims the benefit of People's Republic of China application Serial No. 201710036189.3, filed Jan. 17, 2017, the disclosure of which is incorporated by reference herein in its entirety.

BACKGROUND

Technical Field

The disclosure relates in general to an integrated circuit (IC) structure and a method of fabricating the same, and more particularly to an IC structure with semiconductor devices and a method of fabricating the same.

Description of the Related Art

Reduction of feature size, improvements of the rate, the efficiency, the density and the cost per integrated circuit (IC) unit are the important goals in the semiconductor technology. The electrical properties of the device have to be maintained even improved (ex: with the decrease of the size) to meet the requirements of the commercial products in applications. The layers and components with defects, such as position misalignment, incomplete profiles and insufficient distance between the components, would have considerable effects on the electrical performance of the device.

For example, during fabricating a conventional IC structure, it is preferably to provide a sufficient distance (ex: over one hundred of micrometers) between a low-side region and a high-side region on the substrate, each region containing a lateral-diffusion MOS transistor, for sustaining large voltage drop and maintaining the electrical characteristics of the IC structure; however, this would limit the size reduction of the IC structure.

SUMMARY

The disclosure is directed to an integrated circuit (IC) structure with semiconductor devices and a method of fabricating the same. The semiconductor devices formed within the different regions are isolated by an ultra-deep (UD) trench isolation structure.

According to one aspect of the present disclosure, an integrated circuit (IC) structure is provided, comprising a substrate having a top surface and a bottom surface oppositely, and the substrate comprising a plurality of regions; plural semiconductor devices formed at the substrate and respectively within the plurality of regions; and an ultra-deep (UD) trench isolation structure formed in the substrate and surrounding peripheries of each of the plurality of regions for structurally and physically isolating the semiconductor devices within different regions of the plurality of regions. The UD trench isolation structure penetrates the substrate by extending from the top surface of the substrate to the bottom surface of the substrate.

According to one aspect of the present disclosure, a method of fabricating an IC structure, comprising: providing a substrate having a plurality of predetermined regions; forming an ultra-deep (UD) trench isolation structure in the substrate and surrounding peripheries of each of the plurality of predetermined regions, wherein the UD trench isolation structure extends from a top surface of the substrate downwardly; and lapping backside of the substrate until a lower surface of the UD trench isolation structure being exposed on a bottom surface of the substrate, wherein the bottom surface is opposite to the top surface of the substrate.

The disclosure will become apparent from the following detailed description of the preferred but non-limiting embodiments. The following description is made with reference to the accompanying drawings.

DETAILED DESCRIPTION

Figure 1A:
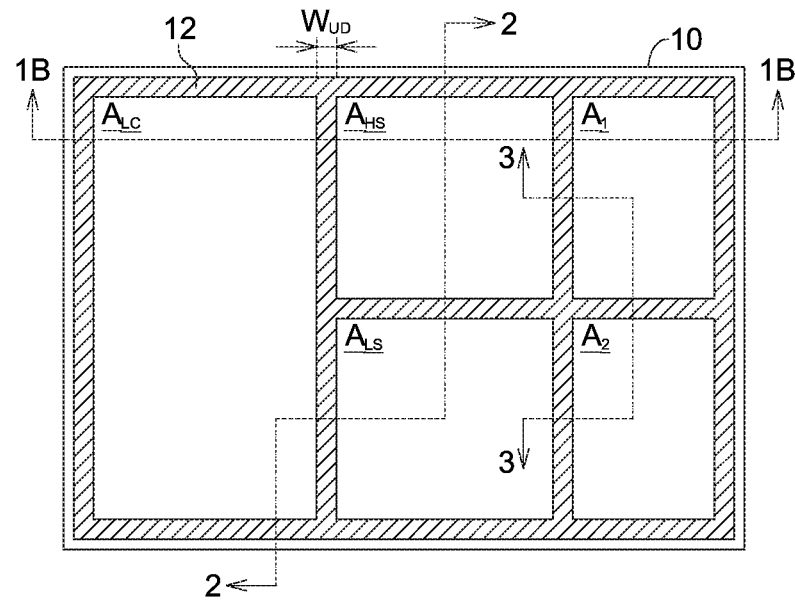
FIG. 1A simply depicts a top view of an integrated circuit (IC) structure having a substrate according to one embodiment of the present disclosure.

In the embodiments of the present disclosure, an integrated circuit (IC) structure with semiconductor devices and a method of fabricating the same are provided. The semiconductor devices formed within the different regions of a substrate are isolated by an ultra-deep (UD) trench isolation structure. According to embodiment, the UD trench isolation structure penetrates the substrate by extending from the top surface of the substrate to the bottom surface of the substrate. For an IC structure in the application, the embodied design having an UD trench isolation structure provides a great isolation between the semiconductor devices within the different regions of the substrate. Also, the embodied design having an UD trench isolation structure achieves a size reduction of the IC, thereby saving the manufacturing cost. Additionally, in some embodiments, some regions in the semiconductor devices such as a first region $A_1$ adjacent to a high-side region $A_{HS}$ and/or a second region $A_2$ adjacent to a low-side region $A_{LS}$ are implemented by using at least one of vertical double-diffused metal oxide semiconductor (VDMOS) transistors, which significantly enhances the heat dissipations of the semiconductor devices, thereby improving the reliability of the semiconductor devices and prolonging the operation life of the IC structure.

Embodiments are provided hereinafter with reference to the accompanying drawings for describing the related configurations of integrated circuit (IC) structures and semiconductor devices formed within the regions of a substrate. Related structural details, such as layers and spatial arrangement, are further described in the embodiments as below. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1B:
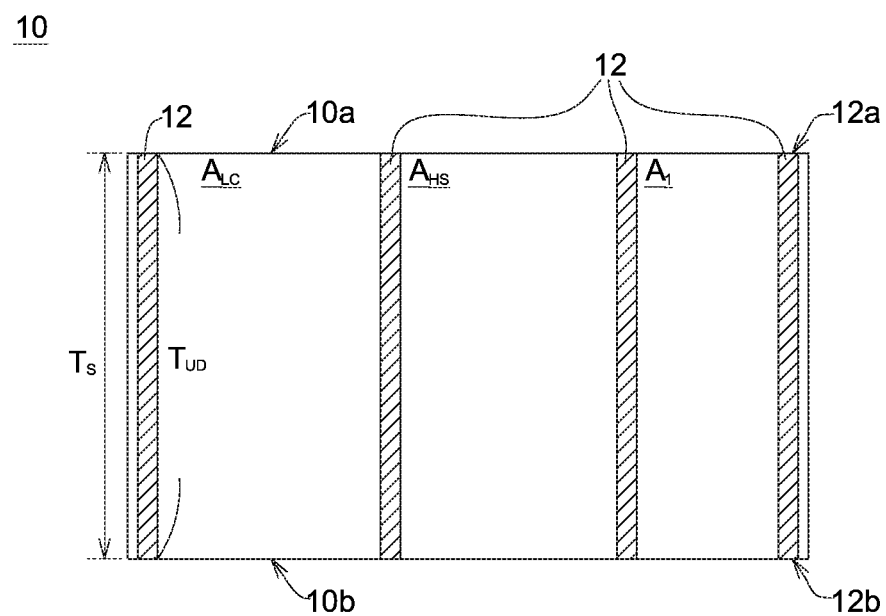
FIG. 1B simply depicts a cross-sectional view of the substrate of FIG. 1A along a cross-sectional line 1B-1B.

FIG. 1A simply depicts a top view of an integrated circuit (IC) structure having a substrate according to one embodiment of the present disclosure. FIG. 1B simply depicts a cross-sectional view of the substrate of FIG. 1A along a cross-sectional line 1B-1B. In one embodiment, the substrate 10 of an IC structure has several regions, several semiconductor devices (such as metal oxide semiconductor devices or the likes) respectively formed within the regions of the substrate 10. As shown in FIG. 1A, an ultra-deep (UD) trench isolation structure 12 is formed in the substrate 10 and surrounds the periphery of each of the regions. The UD trench isolation structure 12 penetrates the substrate 10 by extending from the top surface 10a to the bottom surface 10b of the substrate 10, as shown in FIG. 1B. According to the embodiment, the UD trench isolation structure structurally (and physically) isolates the semiconductor devices within different regions of the regions.

Since the UD trench isolation structure 12 penetrates through the substrate 10, it provides great isolation between the semiconductor devices within the different regions. According to the embodiment, a depth $T_{UD}$ of the UD trench isolation structure 12 is substantially equal to a thickness $T_S$ of the substrate 10. In one embodiment, the depth $T_{UD}$ of the UD trench isolation structure 12 is at least 60 μm or more, such as in a range of about 60 μm to about 65 μm. Also, in one embodiment, a width of the UD trench isolation structure is at least 1 μm or more, such as in a range from 2 μm to 3 μm.

Moreover, as shown in FIG. 1B, the UD trench isolation structure 12 has an upper surface 12a and a lower surface 12b positioned oppositely, wherein the lower surface 12b is exposed on the bottom surface 10b of the substrate 10, and the upper surface 12a is exposed on the top surface 10a of the substrate 10. Also, in one embodiment, the upper surface 12a of the UD trench isolation structure 12 is substantially aligned or coplanar with the top surface 10a of the substrate 10, and the lower surface 12b of the UD trench isolation structure 12 is substantially aligned or coplanar with the bottom surface 10b of the substrate 10. Additionally, the UD trench isolation structure 12 comprises an insulating material, and material examples include nitrides, oxides, and a combination thereof, such as silicon nitride or silicon oxide, etc. However, the disclosure is not limited to the numerical values and the exemplified materials as listed above.

In an IC structure of the practical application, the substrate 10 has at least a high-side region $A_{HS}$ and a low-side region $A_{LS}$, and the high-side region $A_{HS}$ and the low-side region $A_{LS}$ can be positioned adjacently and apart from each other by the UD trench isolation structure 12 of the embodiment for saving the space of the substrate 10. As shown in FIG. 1A, the peripheries of the high-side region $A_{HS}$ and the low-side region $A_{LS}$ are surrounded by the UD trench isolation structure 12 of the embodiment. In this embodiment, the high-side region $A_{HS}$, the low-side region $A_{LS}$, a first region $A_1$, a second region $A_2$ and a logic region $A_{LC}$ are exemplified for illustrating one of region arrangements of the substrate 10, as shown in FIG. 1A. However, it is noted that the region arrangements of the substrate 10 are not limited to the exemplification of FIG. 1A. The sizes, relative positions and numbers of the possible regions of a substrate in which the semiconductor devices are formed can be varied and determined according to the actual needs or requirement of the practical application.

Figure 2:
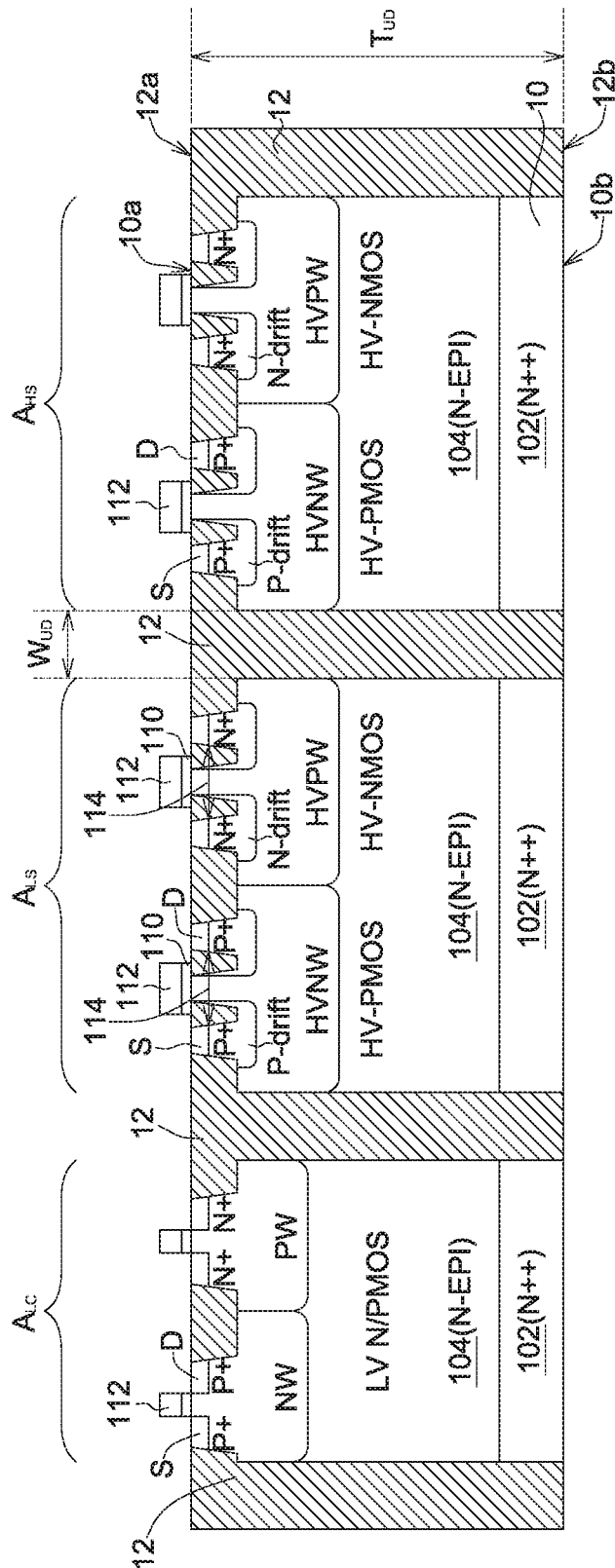
FIG. 2 depicts a cross-sectional view of a substrate and semiconductor devices formed within the regions of the substrate according to one embodiment of the present disclosure.

FIG. 2 depicts a cross-sectional view of a substrate and semiconductor devices formed within the regions of the substrate according to one embodiment of the present disclosure. In FIG. 2, the cross-sectional view of the substrate is taken from such as the cross-sectional line 2-2 in FIG. 1A, to show the semiconductor devices formed within the high-side region $A_{HS}$, the low-side region $A_{LS}$, and the logic region $A_{LC}$. Also, those regions of the substrate 10 comprises a metal oxide semiconductor field effect transistor (MOS transistor)(as the semiconductor device formed within the region), which has a source region S and a drain region D positioned at two sides of a gate 112. Noted that configurations of the MOS transistors formed within the high-side region $A_{HS}$, the low-side region $A_{LS}$ and the logic region $A_{LC}$ can be modified or changed according to actual needs of the practical application, and the disclosure is not limited to the configurations as shown in FIG. 2.

As shown in FIG. 2, each of the high-side region $A_{HS}$ and the low-side region $A_{LS}$ comprises at least one complementary metal-oxide-semiconductor (CMOS) transistor (i.e. implemented by a combination of a p-channel MOS (PMOS) transistor and an n-channel MOS (NMOS) transistor); in the embodiment, a CMOS transistor formed by a high voltage (HV)-PMOS and a HV-NMOS is exemplified as a semiconductor device formed within the region. Take an n-channel MOS (NMOS) transistor for example, a NMOS transistor comprises an N++ substrate (i.e. implanted by N++ dopants) 102, an N-Epitaxial (epi) layer 104 on the N++ substrate 102, a high voltage P type well (HVPW), a N-drift region formed within the HVPW, the N+ source regions S and the drain region D, a gate electrode (ex: N+ polysilicon) 112 and a gate oxide 110 disposed under the N+ polysilicon gate 112, wherein a horizontal channel 114 is diffused from an edge of the source region S/the drain region D near the gate 112, as shown in FIG. 2. A p-channel MOS (PMOS) transistor adjacent to the NMOS transistor possesses similar structure except for the HVNW in the N-Epitaxial (epi) layer 104, the P type of the dopants for the source region S/the drain region D and the drift region (P).

As shown in FIG. 1A, a first region $A_1$ and a second region $A_2$ are further depicted for illustrating one possible region arrangement of the substrate 10. The first region $A_1$ is positioned in the vicinity of the high-side region $A_{HS}$ and electrically connected to the high-side region $A_{HS}$ (ex: by wires above the substrate 10; and the wires not shown in the figures). The second region $A_2$ is positioned in the vicinity of the low-side region $A_{LS}$ and electrically connected to the low-side region $A_{LS}$. In one embodiment, a periphery of the first region $A_1$ is surrounded by the UD trench isolation structure 12, so that the first region $A_1$ can be physically apart from the high-side region $A_{HS}$ due to the formation of the embodied UD trench isolation structure 12. Similarly, a periphery of the second region $A_2$ is surrounded by the UD trench isolation structure 12, so that the second region $A_2$ can be physically apart from the low-side region $A_{LS}$ due to the formation of the embodied UD trench isolation structure 12. With the UD trench isolation structure 12 of the embodiment, those regions (in which the semiconductor devices are formed) can be arranged as close as possible for reducing the total area of the substrate 10; for example, the smallest distance between two adjacent regions can be equal to the width $W_{UD}$ of the UD trench isolation structure 12. In one embodiment, the width $W_{UD}$ of the UD trench isolation structure 12 is in a range from 2 μm to 3 μm. Although the arrangement of the related regions in FIG. 1A is provided by setting the embodied UD trench isolation structure 12 between each other for greatly reducing the area of the substrate 10 (saving space), it is not necessary to implement the embodiment by restricting the region arrangement as shown in FIG. 1A. It is noted that arrangements of those regions is not limited to the exemplification of FIG. 1, and the sizes and relative positions of those regions can be varied and determined according to the actual needs or requirement of the practical application. According to the embodiment, at least one vertical double-diffused metal oxide semiconductor (VDMOS) transistor can be formed in at least one of the first region $A_1$ and the second region $A_2$ as a semiconductor device disposed within the related region (i.e. a VDMOS transistor formed in the first region $A_1$ or in the second region $A_2$). Also, the VDMOS transistor can be configured with a planar structure or a trench-gate structure.

Figure 3:
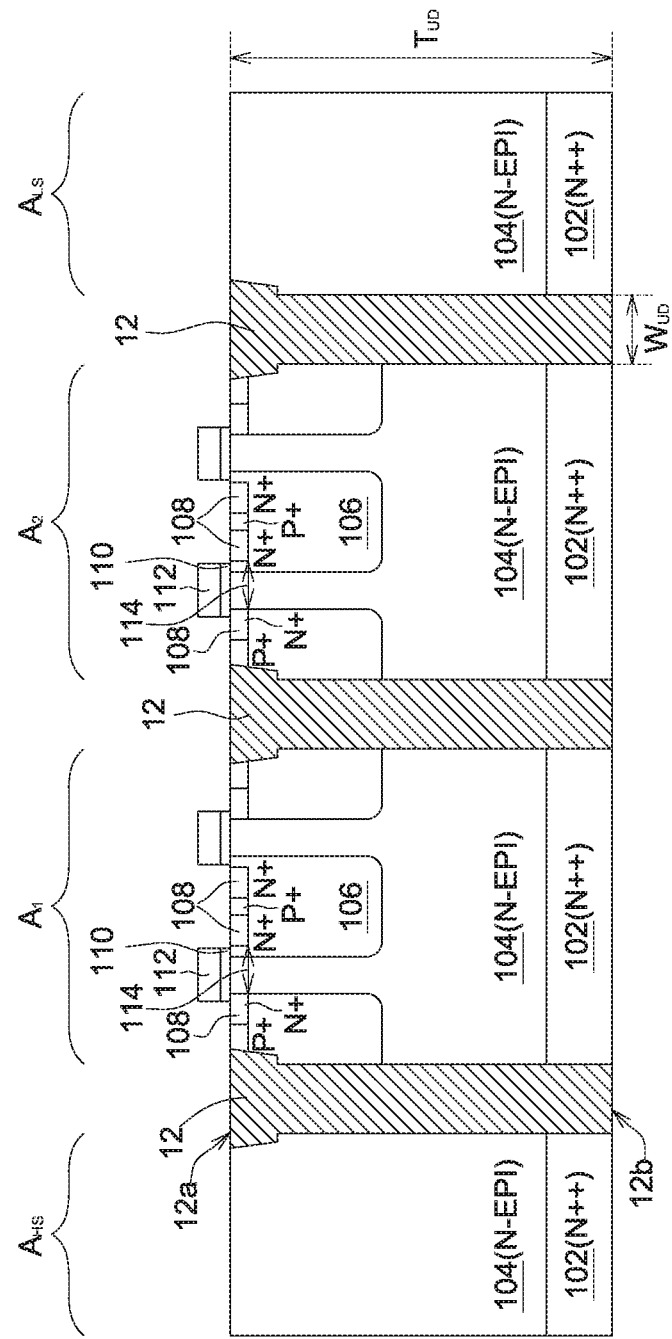
FIG. 3 depicts a cross-sectional view of another substrate and semiconductor devices formed within the regions of the substrate according to one embodiment of the present disclosure.

FIG. 3 depicts a cross-sectional view of another substrate and semiconductor devices formed within the regions of the substrate according to one embodiment of the present disclosure. In FIG. 3, the cross-sectional view of the substrate 10 related to the high-side region $A_{HS}$, the first region $A_1$, the second region $A_2$ and the low-side region $A_{LS}$ is taken from such as the cross-sectional line 3-3 in FIG. 1A, to show the semiconductor devices formed within the first region $A_1$ and the second region $A_2$. In FIG. 3, at least a VDMOS transistor with a planar structure is exemplified as the semiconductor devices respectively formed within the first region $A_1$ and the second region $A_2$. As shown in FIG. 3, the VDMOS transistor with a planar structure formed within the first region $A_1$ and the second region $A_2$ may comprise an N++ substrate (i.e. implanted by N++ dopants) 102 acting as a drain region, an N-Epitaxial (epi) layer 104 on the N++ substrate 102 (or on the drain region), a P-body region 106, the N+ source regions 108 formed within the P-body region 106, a gate electrode (ex: N+ polysilicon) 112 and a gate oxide 110 disposed under the gate 112, wherein a horizontal channel 114 is diffused from an edge of the N+ source region 108 near the gate 112.

Figure 4:
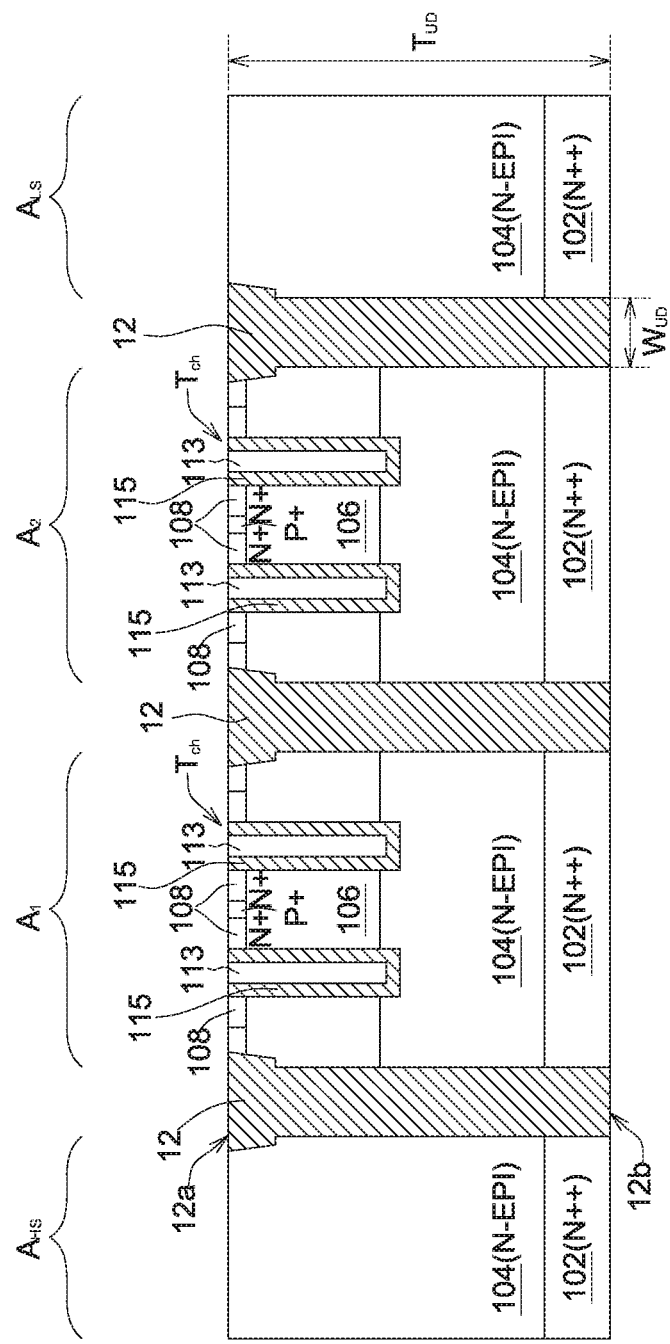
FIG. 4 depicts a cross-sectional view of a further substrate and semiconductor devices formed within the regions of the substrate according to one embodiment of the present disclosure.

FIG. 4 depicts a cross-sectional view of a further substrate and semiconductor devices formed within the regions of the substrate according to one embodiment of the present disclosure. In FIG. 4, the cross-sectional view of the substrate 10 related to the high-side region $A_{HS}$, the first region $A_1$, the second region $A_2$ and the low-side region $A_{LS}$ is taken from such as the cross-sectional line 3-3 in FIG. 1A, to show the semiconductor devices formed within the first region $A_1$ and the second region $A_2$. In FIG. 4, at least a VDMOS transistor with a trench-gate structure is exemplified as the semiconductor devices respectively formed within the first region $A_1$ and the second region $A_2$. As shown in FIG. 4, the VDMOS transistor with a trench-gate structure (having vertical channel and gate) formed within the second region $A_2$ may comprise an N++ substrate 102 acting as a drain region, an N-Epitaxial (epi) layer 104 on the N++ substrate 102 (/the drain region), a P-body region 106, the N+ source regions 108 formed within the P-body region 106, a gate oxide 110 and a gate structure. The gate structure extends downwardly from the top surface 10a of the substrate 10, and the gate structure comprises a gate 113 (ex: N+ polysilicon) in a vertical trench $T_{ch}$ and an insulating layer 115 (gate dielectric such as oxide) surrounding the gate 113 in the vertical trench $T_{ch}$ to control the current conduction. Because of this configuration of the gate 113 in the vertical trench $T_{ch}$, the gate structure as shown in FIG. 4 is often referred to as a trench gate in which length of the gate 113 is controlled by the depth of the vertical trench $T_{ch}$. The depth of the vertical trench $T_{ch}$ would be deep enough to cross the P-body region 106 below the top surface 10a of the substrate 10. Different from the horizontal channel, the vertical MOSFET configured with a trench-gate structure exists a vertical channel (ex: along the extending direction of the vertical trench Tch) diffused from an edge of the source region 108 near the gate 113, and also conducts the current vertically.

According to the embodiment, no matter the VDMOS transistor is configured with a planar structure or a trench-gate structure, a source region (ex: 108) of the VDMOS transistor formed in at least one of the first region $A_1$ and the second region $A_2$ of an embodied substrate 10 is positioned at the top surface 10a of the substrate 10, and a drain region (ex: 102) of the VDMOS transistor in one of the first region $A_1$ and the second region $A_2$ of an embodied substrate 10 is positioned at the bottom surface 10b of the substrate 10, thereby effectively enhancing the heat dissipations of VDMOS transistor. In one embodiment, a heat sink can be attached on the drain region for directly removing the heat generated by the VDMOS transistor (/semiconductor device).

Additionally, in one embodiment, a periphery of the logic region $A_{LC}$ (apart from the low-side region $A_{LS}$ and the high-side region $A_{HS}$) can be surrounded by the UD trench isolation structure 12, so that the logical region $A_{LC}$ is physically apart from the high-side region $A_{HS}$ and the low-side region $A_{LS}$ by the width $W_{UD}$ of the UD trench isolation structure 12 for saving the space of the substrate 10, thereby reducing the overall area of an IC structure in the application. Also, at least one low voltage (LV)-MOS transistor is formed in the logic region $A_{LC}$ Although FIG. 2 exemplifies a MOS transistor formed in the logic region $A_{LC}$, the disclosure is not limited thereto. The identical and/or similar elements of the MOS in the logic region $A_{LC}$ and the low-side region $A_{LS}$/the high-side region $A_{HS}$ are designated with the same and/or similar reference numerals, and the details of the configurations are not redundantly repeated.

It is noted that the semiconductor devices in each of the regions (ex: the high-side region $A_{HS}$, the low-side region $A_{LS}$, the logic region $A_{LC}$, the first region $A_1$ and the second region $A_2$) are not limited to the exemplified types of the MOS transistors or the VDMOS transistors as depicted in FIG. 2, FIG. 3 and FIG. 4. Alternatively, the high-side region $A_{HS}$ and the low-side region $A_{LS}$ could comprise other types of the semiconductor devices. Also, the first region $A_1$ and the second region $A_2$ could comprise the semiconductor devices as illustrated in the VDMOS transistor configured with a planar structure or a trench-gate structure or other applicable type of gate structure, depending on the practical requirement of the applications. Thus, the disclosure is not limited to the exemplified configurations.

Figure 5A:
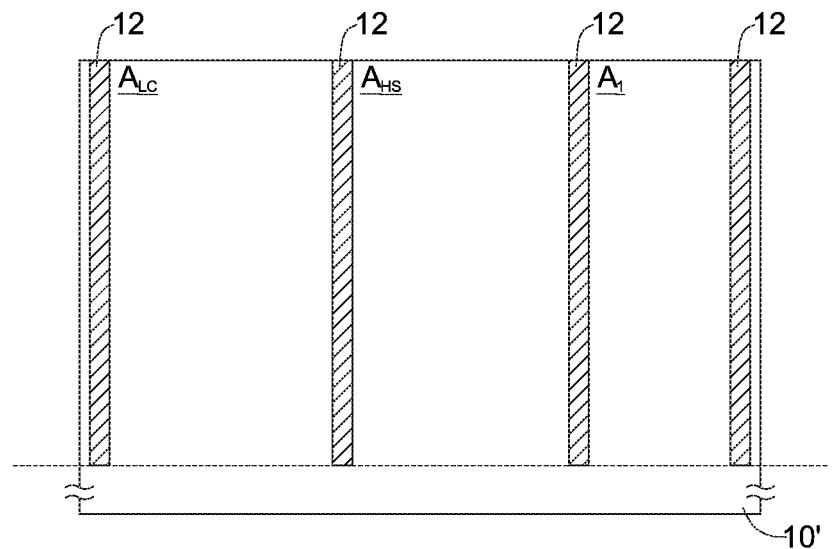
FIG. 5A-FIG. 5B illustrate a method of fabricating an IC structure according to one embodiment of the present disclosure.
Figure 5B:
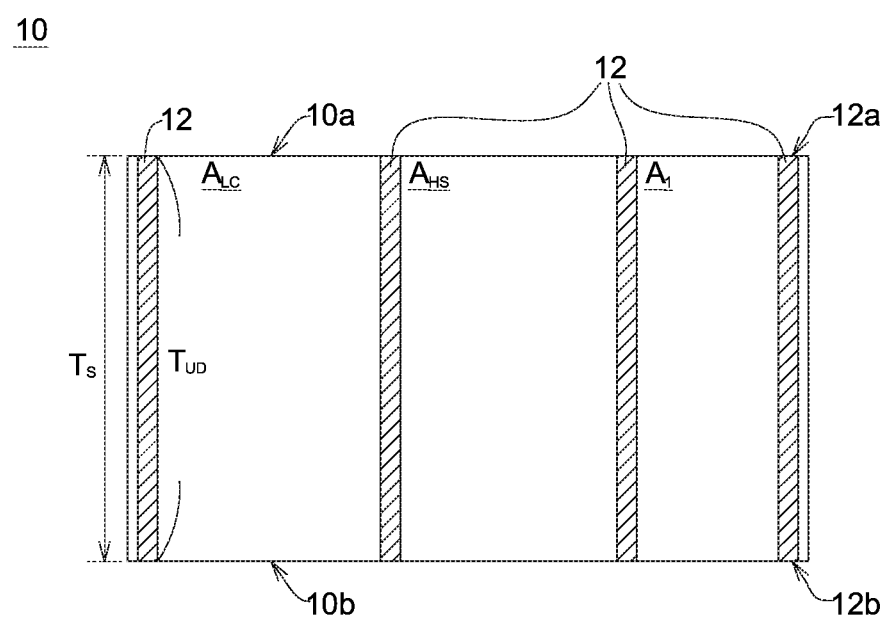

There could be several ways to form the UD trench isolation structure 12 of the embodiment. For example, in one practical manufacturing process, the UD trench isolation structure 12 can be formed by extended downwardly from the top surface 10a of the substrate 10 (wafer) to an ultra-deep position in the substrate 10 (wafer); after manufacturing the semiconductor devices required for the IC structure, the backside lapping is performed for thinning or removing part of the substrate/wafer, so as to expose the lower surface 12b of the UD trench isolation structure 12 on the bottom surface 10b of the substrate 10, and achieving a required thickness of the substrate 10 in the final product of the application. FIG. 5A-FIG. 5B illustrate a method of fabricating an IC structure according to one embodiment of the present disclosure. As shown in FIG. 5A, a wafer such as a substrate 10' is provided, and an ultra-deep (UD) trench isolation structure 12 is formed in the substrate 10' by surrounding peripheries of each of the predetermined regions (ex. the high-side region $A_{HS}$/the low-side region $A_{LS}$/the first region $A_1$/the second region $A_2$/the logic region $A_{LC}$); meanwhile, the UD trench isolation structure 12 has not penetrated the substrate 10'. FIG. 5A-FIG. 5B depict the high-side region $A_{HS}$, the low-side region $A_{LS}$ and the first region $A_1$ for illustration. Then, backside lapping of the substrate 10' is performed until a lower surface 12b of the UD trench isolation structure 12 being exposed on a bottom surface 10b of the substrate 10, as shown in FIG. 5B; meanwhile, the UD trench isolation structure 12 penetrates the substrate 10. Moreover, formation of the semiconductor devices (not shown in FIG. 5A/5B) required at the substrate and respectively within different regions of the predetermined regions can be performed before or after lapping the backside of the substrate 10'. For example, the semiconductor devices can be formed before forming the UD trench isolation structure 12 as shown in FIG. 5A; or formed after generating the UD trench isolation structure 12 as shown in FIG. 5A but before backside lapping as shown in FIG. 5B; or formed after backside lapping as shown in FIG. 5B. Therefore, for a final product, the UD trench isolation structure 12 penetrates the substrate 10 by extending from the top surface 10a to the bottom surface 10b of the substrate (i.e., the lower surface 12b of the UD trench isolation structure 12 exposed on the bottom surface 10b of the substrate 10 as shown in FIG. 5B). Also, the UD trench isolation structure 12 of the embodiment can be formed before forming STI loop (before forming the MOS/VD-MOS), or in STI loop (after forming the MOS/VDMOS). The disclosure has no particular limitation to the manufacturing process.

According to the aforementioned descriptions, the IC structure of the embodiment(s) possesses many advantages. According to the embodied design, since the UD trench isolation structure 12 penetrates through the substrate 10 (i.e. having a depth $T_{UD}$ equal to the thickness $T_S$ of the substrate 10), it provides great isolation between the semiconductor devices within the different regions of the substrate 10. Also, the embodied design of the UD trench isolation structure 12 enables the distance between adjacent regions of the substrate 10 to be decreased (for example, a width $W_{UD}$ of the UD trench isolation structure 12 can be decreased to about 1 μm such as in a range of 2 μm to 3 μm) for saving the area of the substrate 10, thereby reducing the size of the IC structure required for disposing the semiconductor devices and decreasing the manufacturing cost. Moreover, when the semiconductor devices in some of the regions of the substrate 10 (such as the first region $A_1$ and/or the second region $A_2$) are implemented by using the VDMOS transistors (i.e. the source region and the drain region respectively positioned at the top surface and the bottom surface of the substrate), it enhances the heat dissipations of the semiconductor devices, thereby improving reliability of the semiconductor devices during operation and prolonging the operation life of the IC structure in application. Also, the manufacturing method of the embodied UD trench isolation structure is compatible with the current fabrication process, which is suitable for mass production.

Other embodiments with different configurations of known elements in the semiconductor device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit (IC) structure, comprising:
   a substrate having a top surface and a bottom surface oppositely, and the substrate comprising a plurality of regions;
   semiconductor devices formed at the substrate and respectively within the plurality of regions;
   an ultra-deep (UD) trench isolation structure formed in the substrate and surrounding peripheries of each of the plurality of regions for isolating the semiconductor devices within different regions of the plurality of regions;
   a gate oxide and a gate electrode, both disposed on the top surface and above the top surface of the UD trench isolation structure;
   wherein the UD trench isolation structure penetrates the substrate in its entirety by extending from the top surface of the substrate to the bottom surface of the substrate, and a lower surface of the UD trench isolation structure is exposed at the bottom surface of the substrate, wherein none of drain regions, a portion of the substrate and an insulative material layer covers the lower surface of the UD trench isolation structure; wherein the plurality of regions comprises a high-side region and a low-side region apart from each other by the UD trench isolation structure; and peripheries of the high-side region and the low-side region are surrounded by the UD trench isolation structure.

2. The IC structure according to claim 1, wherein a depth of the UD trench isolation structure is substantially equal to a thickness of the substrate.

3. The IC structure according to claim 1, wherein the UD trench isolation structure comprises an insulating material of nitrides, oxides or both.

4. The IC structure according to claim 1, wherein the plurality of regions further comprises a first region adjacent to and electrically connected to the high-side region, and a periphery of the first region is surrounded by the UD trench isolation structure.

5. The IC structure according to claim 4, wherein a first vertical double-diffused metal oxide semiconductor (VDMOS) transistor is formed in the first region.

6. The IC structure according to claim 1, wherein the plurality of regions further comprises a second region adjacent to and electrically connected to the low-side region, and a periphery of the second region is surrounded by the UD trench isolation structure.

7. The IC structure according to claim 6, wherein a second vertical double-diffused metal oxide semiconductor (VDMOS) transistor is formed in the second region.

8. The IC structure according to claim 1, wherein the plurality of regions further comprises a first region adjacent to and electrically connected to a high-side region, and a second region adjacent to and electrically connected to a low-side region, wherein at least one of the first region and the second region comprises a vertical double-diffused metal oxide semiconductor (VDMOS) transistor, and a source region and one of the drain regions of the VDMOS transistor are positioned at the top surface and the bottom surface of the substrate, respectively.

9. The IC structure according to claim 8, wherein the VDMOS transistor is configured with a planar structure and the VDMOS transistor comprises the gate oxide on the top surface of the substrate, the gate electrode on the gate oxide, and a horizontal channel diffused from an edge of the source region near the gate.

10. The IC structure according to claim 8, wherein the VDMOS transistor is configured with a trench-gate structure, and the VDMOS transistor comprises a gate structure extending downwardly from the top surface of the substrate, and the gate structure comprises a gate in a vertical trench and an insulating layer surrounding part of the gate in the vertical trench, wherein a vertical channel is diffused from an edge of the source region near the gate.

11. The IC structure according to claim 1, wherein a depth of the UD trench isolation structure is at least 60 μm or more.

12. The IC structure according to claim 1, wherein a width of the UD trench isolation structure is at least 1 μm or more.

* * * * *